United States Patent
Frank et al.

(10) Patent No.: US 10,666,146 B2
(45) Date of Patent: May 26, 2020

(54) BIDIRECTIONAL INVERTING BUCK-BOOST CONVERTER CONVERTING DISSIPATION CURRENT INTO RECYCLING CURRENT

(71) Applicant: TEXAS INSTRUMENTS INCORPORATED, Dallas, TX (US)

(72) Inventors: Ingolf Edgar Frank, Freising (DE); Lars Lotzenburger, Erding (DE); Matthieu Etienne Chevrier, Freising (DE)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 16/291,287

(22) Filed: Mar. 4, 2019

(65) Prior Publication Data

US 2019/0273438 A1  Sep. 5, 2019

Related U.S. Application Data

(60) Provisional application No. 62/638,604, filed on Mar. 5, 2018.

(51) Int. Cl.
  *H02M 3/158* (2006.01)
  *G01R 19/165* (2006.01)
  *H02M 1/32* (2007.01)
  *H02M 1/00* (2006.01)

(52) U.S. Cl.
  CPC ........ *H02M 3/1584* (2013.01); *G01R 19/165* (2013.01); *H02M 1/32* (2013.01); *H02M 3/1582* (2013.01); *H02M 2001/0003* (2013.01); *H02M 2001/008* (2013.01); *H02M 2001/0048* (2013.01)

(58) Field of Classification Search
  CPC .... H02M 3/1584; H02M 1/32; H02M 3/1582; H02M 2001/0003; H02M 2001/0048; H02M 2001/008; H02M 3/158; G01R 19/165

See application file for complete search history.

(56) References Cited

U.S. PATENT DOCUMENTS

| 4,639,822 A | 1/1987 | Kubach et al. |
| 4,698,559 A | 10/1987 | Baur et al. |
| 5,396,165 A * | 3/1995 | Hwang ..................... G05F 1/70 323/210 |

(Continued)

FOREIGN PATENT DOCUMENTS

| JP | 06177732 A | 6/1994 |
| SU | 1390797 A1 | 4/1988 |

OTHER PUBLICATIONS

Search Report for PCT Application No. PCT/US19/20657, dated Jun. 6, 2019, 1 page.

*Primary Examiner* — Adolf D Berhane
(74) *Attorney, Agent, or Firm* — Mark Allen Valetti; Charles A. Brill; Frank D. Cimino

(57) ABSTRACT

In some examples, a device comprises a capacitor a bidirectional inverting buck-boost converter coupled to the capacitor and configured to couple to multiple loads and to a voltage source, wherein the bidirectional inverting buck-boost converter is configured to: compare a voltage across the capacitor with a reference voltage; and based on the comparison, facilitate converting a dissipation current flowing from one of the multiple loads into a recycling current.

19 Claims, 9 Drawing Sheets

(56) References Cited

U.S. PATENT DOCUMENTS

| | | | |
|---|---|---|---|
| 5,523,632 A | 6/1996 | Seragnoli | |
| 5,745,351 A * | 4/1998 | Taurand | H02M 3/33584 |
| | | | 363/131 |
| 6,121,768 A * | 9/2000 | Taurand | G01R 15/183 |
| | | | 324/117 R |
| 6,452,419 B1 * | 9/2002 | Ovens | G05F 3/18 |
| | | | 326/80 |
| 9,263,948 B1 * | 2/2016 | Vovos | H02M 3/158 |
| 9,584,022 B1 * | 2/2017 | Galvano | H02M 3/158 |
| 2004/0196075 A1 * | 10/2004 | Nair | H02M 3/1588 |
| | | | 327/110 |
| 2015/0288209 A1 * | 10/2015 | Rippel | H02J 7/0065 |
| | | | 320/107 |
| 2015/0311783 A1 * | 10/2015 | Saadat | G05F 1/577 |
| | | | 323/267 |
| 2015/0311884 A1 * | 10/2015 | Saadat | H03K 3/012 |
| | | | 327/109 |
| 2016/0001662 A1 * | 1/2016 | Miller | B60L 11/182 |
| | | | 307/104 |
| 2019/0157885 A1 * | 5/2019 | Rippel | H02J 7/0042 |

\* cited by examiner

BIDIRECTIONAL INVERTING BUCK-BOOST CONVERTER CONVERTING DISSIPATION CURRENT INTO RECYCLING CURRENT

CROSS-REFERENCE TO RELATED APPLICATIONS

The present application claims priority to U.S. Provisional Patent Application No. 62/638,604, which was filed Mar. 5, 2018, is titled "Inductive Switching With Energy Recycling," and is hereby incorporated herein by reference in its entirety.

SUMMARY

In accordance with one example, a device comprises a capacitor; a bidirectional inverting buck-boost converter coupled to the capacitor and configured to couple to multiple loads and to a voltage source, wherein the bidirectional inverting buck-boost converter is configured to: compare a voltage across the capacitor with a reference voltage; and based on the comparison, facilitate converting a dissipation current flowing from one of the multiple loads into a recycling current.

In accordance with another example, a system comprises a controller; a first switch coupled to the controller; a load coupled to the switch; a bidirectional inverting buck-boost converter coupled to the switch, the load, and a voltage supply, wherein the bidirectional inverting buck-boost converter comprises: a digital circuit; a pulse width modulation (PWM) signal generator coupled to the digital circuit; a plurality of switches coupled to the PWM signal generator; and an inductor coupled to the plurality of switches; a first capacitor coupled to the switch and the load, wherein the first capacitor is coupled to the bidirectional inverter buck-boost converter at a first node; and a second capacitor coupled to the bidirectional inverting buck-boost converter and the switch.

In accordance with yet another example, a method comprises obtaining a bidirectional inverting buck-boost converter coupled to a capacitor and configured to couple to multiple loads and to a voltage source; charging the capacitor to a reference voltage; comparing, by the bidirectional inverting buck-boost converter, a voltage at a node coupled to the capacitor with the reference voltage; and in response to the comparison, adapting the bidirectional inverting buck-boost converter to keep the voltage at the node substantially equal to the reference voltage.

BRIEF DESCRIPTION OF THE DRAWINGS

For a detailed description of various examples, reference will now be made to the accompanying drawings in which:

FIG. 5(*b*) depicts an illustrative oscilloscope diagram depicting voltage and current curves of an electrical system that includes a recycling circuit, in accordance with various examples.

FIG. 6(*b*) depicts an illustrative thermal image of the electrical system of FIG. 5(*b*), in accordance with various examples.

DETAILED DESCRIPTION

A load is a component of a circuit that consumes electric power, as opposed to a power source, e.g., a battery or generator, which produces electric power. In some cases, loads include one or more energy storage elements, such as inductors and/or capacitors. An inductive load resists changes in the current flowing through it. When the current flowing through the inductive load changes, it produces a time-varying magnetic field, which induces an electromotive force (EMF) voltage with a polarity (or direction) that opposes the change in the current that created it.

In some cases, the inductive load (e.g., an actuator or a relay) is implemented in an electrical system that converts a current flowing in the inductive load into a mechanical action. Following the mechanical action, the current that resulted in the mechanical action is reduced significantly, which generates an EMF voltage across the inductive load. This EMF voltage needs to be dissipated using a dissipation circuit for the inductive load to return to its rest state and for the electrical system to switch between inductive loads.

During dissipation, the discharge current (also called the dissipation current) flows through the dissipation circuit. Many existing dissipation circuits include a freewheeling diode or a combination of a resistive load (e.g., resistors), a freewheeling diode, and/or a Zener diode. The discharge current flowing through the dissipation circuit peaks at a value equal to the EMF voltage divided by the resistance ($R_{PATH}$) of the path of the discharge current. The $R_{PATH}$ generates a substantial amount of heat during discharge and induces thermal stress in the electrical system. Therefore, systems and methods are needed to mitigate the thermal stress that is generated while discharging the inductive load.

Accordingly, at least some aspects of the present disclosure relate to an electrical system that reduces thermal stress by recycling discharge current. Because discharge current generated due to a stored EMF voltage is recycled instead of being dissipated through the conventionally used dissipation circuit, heat generation and the resulting thermal stress are mitigated, and the electrical system can switch between the loads (e.g., inductive loads) while inducing less thermal stress on the switches.

Figure 1:
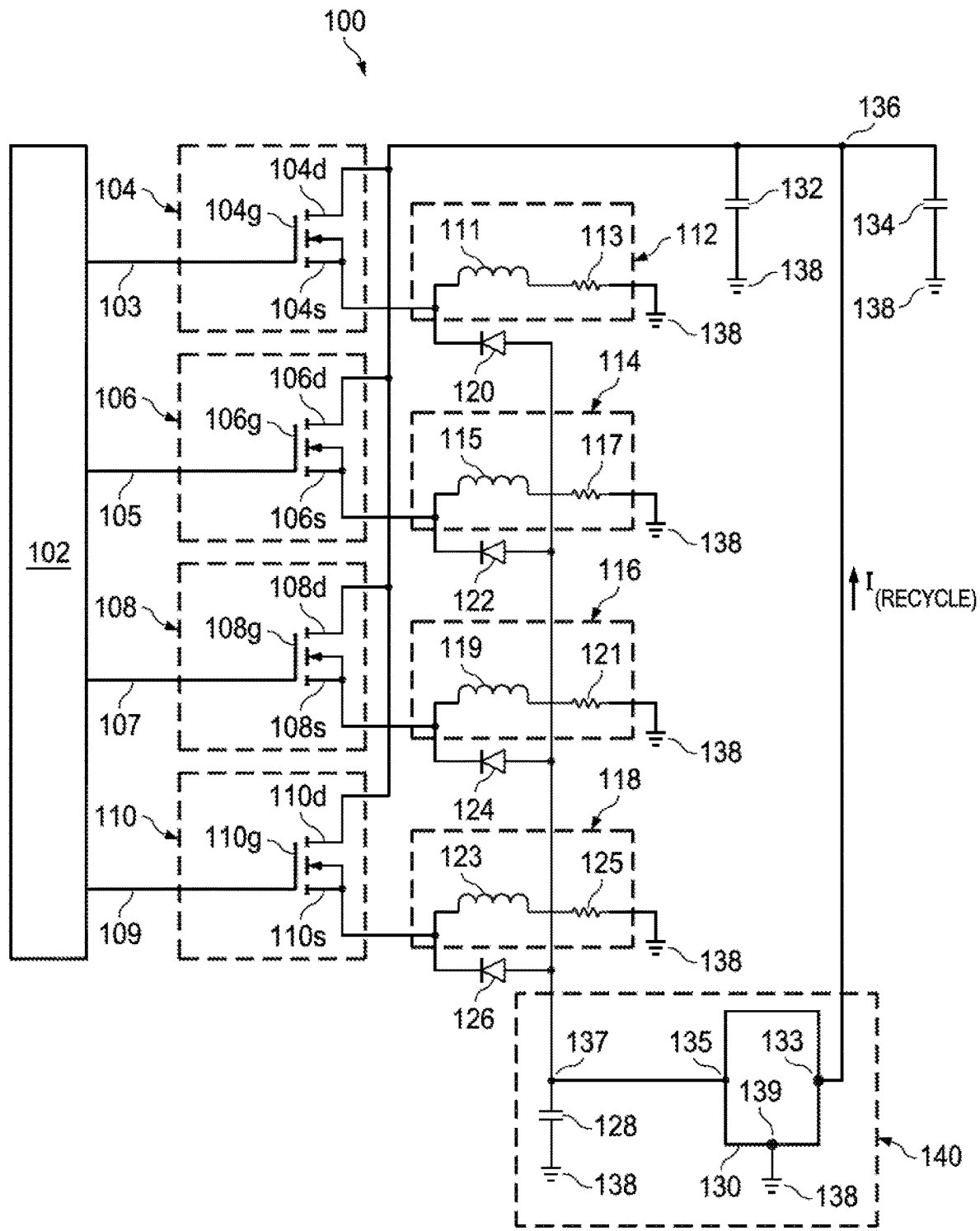
FIG. 1 depicts a schematic diagram of an illustrative electrical system, in accordance with various examples.

Referring now to FIG. 1, a schematic diagram of an illustrative electrical system 100 is shown. In an example, the electrical system 100 is an automobile, although other applications are contemplated and included in the scope of this disclosure. In at least one example, the electrical system 100 includes a controller 102 and switches 104, 106, 108, and 110, which are coupled to the controller 102 via the connecting wires 103, 105, 107, and 109, respectively. The controller 102 is configured to control the switches 104, 106, 108, and 110, e.g., by providing a gate drive signal to the respective gate terminals of the switches 104, 106, 108, and 110. For example, the controller 102 provides the gate drive signal to gate terminals 104g, 106g, 108g, and 110g via connecting wires 103, 105, 107, and 109 respectively. In an example, a gate driver (not expressly shown), which is present in the controller 102, generates the gate drive signals that control the switches 104, 106, 108, and 110.

In at least one example, the controller 102 is also configured to select the switches 104, 106, 108, and 110 to be turned on and off. For example, the controller 102 controls one of the switches, e.g., switch 104, to turn (or remain) on while controlling the remainder of the switches 106, 108, and 110 to remain (or turn) off. This selection (or control) process can be managed by a logic circuit (not expressly shown), which can be implemented using any combination of digital or analog technology components, a processor, a micro-processor, a field-programmable gate array (FPGA), or any other suitable circuitry, the scope of which is not limited herein. In FIG. 1, the switches 104, 106, 108, and 110 are implemented by n-channel metal-oxide-semiconductor field-effect transistors (n-MOSFETs). However, in other examples, other suitable solid-state transistor devices (e.g., bipolar junction transistors (BJTs)) can be employed.

At least one example of the electrical system 100 includes at least some aspects of the controller 102 and the switches 104, 106, 108, and 110 on the same semiconductor die and/or in the same component package. In other examples the controller 102 and the switches 104, 106, 108, and 110 are fabricated separately and configured to couple together. While described as including gate drivers, in at least one example, the controller 102 does not include the gate drivers and instead is configured to couple to the gate drivers.

FIG. 1 further depict loads 112, 114, 116, and 118 that couple to the switches 104, 106, 108, and 110 via their respective source terminals. For example, loads 112, 114, 116, and 118 couple to source terminals 104s, 106s, 108s, and 110s, respectively. The example of FIG. 1 depicts four loads 112, 114, 116, and 118. However, in other examples, the number of loads varies. In an example, the loads 112, 114, 116, and 118 include at least one energy storage element, such as an inductor or transformer. In other examples, the loads 112, 114, 116, and 118 include a combination of one of the energy storage elements and any other suitable circuitry, the scope of which is not limited herein. In one example, the loads 112, 114, 116, and 118 are configured to produce a mechanical action, e.g., trigger a switch contact based on an electrical signal (e.g., voltage) present across them. Examples of such loads include actuators and relays. In the example depicted in FIG. 1, the loads 112, 114, 116, and 118 include inductors 111, 115, 119, and 123, respectively. The loads 112, 114, 116, and 118 also include resistors 113, 117, 121, and 125, respectively.

In the example of FIG. 1, the load 112 includes the inductor 111 and the resistor 113. A terminal of the inductor 111 couples to the source terminal 104s and another terminal of the inductor 111 couples to the resistor 113, which further couples to a ground node 138. The terminal of the inductor 111 that couples to the source terminal 104s also couples to a freewheeling diode 120 at its n-junction. A p-junction of the freewheeling diode 120 further couples to a node 137. Similarly, the load 114 includes the inductor 115 and the resistor 117. A terminal of the inductor 115 couples to the source terminal 106s and another terminal of the inductor 115 couples to the resistor 117, which further couples to the ground node 138. The terminal of the inductor 115 that couples to the source terminal 106s also couples to a freewheeling diode 122 at its n-junction. A p-junction of the freewheeling diode 122 further couples to a node 137.

Similar to the loads 112, 114, the load 116 includes the inductor 119 and the resistor 121. A terminal of the inductor 119 couples to the source terminal 108s and another terminal of the inductor 119 couples to the resistor 121, which further couples to the ground node 138. The terminal of the inductor 119 that couples to the source terminal 108s also couples to a freewheeling diode 124 at its n-junction. A p-junction of the freewheeling diode 124 further couples to a node 137. Yet again, similar to the load 112 described above, the load 118 includes the inductor 123 and the resistor 125. A terminal of the inductor 123 couples to the source terminal 110s and another terminal of the inductor 123 couples to the resistor 125, which further couples to the ground node 138. The terminal of the inductor 123 that couples to the source terminal 108s also couples to a freewheeling diode 126 at its n-junction. A p-junction of the freewheeling diode 126 further couples to a node 137. In an example, the node 137 couples to the ground node 138 via the capacitor 128. The freewheeling diodes 120, 122, 124, and 126 are depicted to be disposed external to the loads 112, 114, 116, and 118, respectively. However, in an example, the loads 112, 114, 116, and 118 include the freewheeling diodes 120, 122, 124, and 126, respectively.

In at least one example, the electrical system 100 includes a recycling circuit 140 that is configured to recycle at least some of the EMF voltage (and, in turn, recycle the discharge current) stored in the loads 112, 114, 116, and 118. In at least one example, the recycling circuit 140 includes a power converter 130 that couples to the nodes 136, 137 at the terminals 133, 135, respectively. In an example, the power converter 130 couples to the ground node 138 via a terminal 139. In one example, the power converter 130 is a bi-directional inverting buck-boost power converter, meaning that the terminals 133, 135 can assume the role of both input and output terminals interchangeably. In one scenario, the power converter 130 is configured to assume that the terminal 133 receives an input signal and the terminal 135 generates an output signal of an opposite polarity than that of the input signal received by the terminal 133. In another scenario, the power converter 130 is configured to assume that the terminal 135 receives an input signal and the terminal 133 generates an output signal of an opposite polarity than that of the input signal received by the terminal 135. In an example, the power converter 130 is configured to generate an output signal with a magnitude that is either greater than, equal to, or less than a magnitude of an input signal provided to the power converter 130.

In an example, the bidirectional behavior of the power converter 130 is achieved by using two separate converters. In such an example, one converter is configured to receive an input signal from the node 136 and generate an inverted output signal at the node 137, and the other converter is configured to receive an input signal from the node 137 and generate an inverted output at the node 136.

In at least one example, the power converter 130 includes multiple switches (not expressly depicted in FIG. 1), which are configured to couple to a pulse width modulation (PWM) signal generator (not expressly shown in FIG. 1) and a logic circuit (not expressly shown in FIG. 1). In an example, the logic circuit of the power converter 130 is implemented using any combination of digital or analog technology components, a processor, a micro-processor, a field-programmable gate array (FPGA), or any other suitable circuitry, the scope of which is not limited herein.

The recycling circuit 140 further includes a capacitor 128. In an example, the capacitor 128 is employed as a clamping element for the loads 112, 114, 116, and 118, as described below. The capacitor 128 couples to the node 137 and the ground node 138.

The capacitor 128 is depicted as separate from the power converter 130. However, in an example, the capacitor 128 is a part of the power converter 130. At least one example of the recycling circuit 140 includes the power converter 130 and the capacitor 128 on the same semiconductor die and/or in the same component package. In an example, the power converter 130 and the capacitor 128 are fabricated separately and configured to couple together.

At least one example of the electrical system 100 includes the recycling circuit 140, the controller 102, and the switches 104, 106, 108, and 110 on the same semiconductor die and/or in the same component package. In other examples, the recycling circuit 140, the controller 102, and the switches 104, 106, 108, and 110 are fabricated separately and configured to couple together.

In at least one example, the electrical system 100 includes a voltage supply 134, which is configured to provide a voltage to the electrical system 100. The voltage supply 134, in the example of FIG. 1, is depicted with a battery symbol. In other examples, the voltage supply 134 may include a controlled voltage source or an array of battery cells. In an example, the voltage supply 134 is a rechargeable battery. The example of the electrical system 100 depicted in FIG. 1 also includes a capacitor 132. In the example of FIG. 1, the drain terminals 104d, 106d, 108d, and 110d couple to each other at a node 136, and the node 136 further couples to the voltage supply 134 and to the capacitor 132. In examples where the voltage supply 134 is a rechargeable battery, in such examples, the capacitor 132 may be omitted from the electrical system 100. In other examples, the capacitor 132 may be employed to store some of the recycled charge received from the recycling circuit 140. In examples where the voltage supply 134 is not a rechargeable battery, the capacitor 132 may be employed to store the charge received from the recycling circuit 140.

In the example of FIG. 1, the drain terminals 104d, 106d, 108d, and 110d couple to the positive terminal of the voltage supply 134, causing the electrical system 100 to be in a high-side configuration. The description herein is not limited to the high-side configuration, and the electrical system 100 can be adapted to perform in other configurations, such as a low-side configuration (illustrated below in FIG. 4) in which the switches 104, 106, 108, and 110 are coupled to the negative terminal of the voltage supply 134. In an example, the capacitor 132 and/or the voltage supply 134 are configured to store the recycled energy received from the loads 112, 114, 116, and 118, as described below.

In an example, the recycling circuit 140 and the capacitor 132 may be fabricated separately and configured to couple together. In other examples, the recycling circuit 140 may include the capacitor 132 and, in such examples, the capacitor 132 is fabricated on the same die as the recycling circuit 140.

In operation, the recycling circuit 140 is configured to dissipate and recycle the EMF voltage of one or more loads 112, 114, 116, and 118. The EMF voltage generates a discharge current, which is recycled into a recycling current using the recycling circuit 140. When the electrical system 100 is turned on for the first time, the recycling circuit 140 is enabled by charging the capacitor 128 to a clamping voltage. In the case of the high-side configuration shown in FIG. 1, this clamping voltage is negative and in the case of the low-side configuration shown in FIG. 4, this clamping voltage is positive. The example shown in FIG. 1 is described below. When the electrical system 100 is turned on for the first time, the power converter 130 detects an uncharged capacitor 128, as further described below in FIG. 3. The power converter 130, following this detection, charges the capacitor 128 to any suitable clamping voltage, for example, −20V. Information (e.g., magnitude) related to the clamping voltage—as also described below—is stored in the power converter 130. After charging the capacitor 128 to the clamping voltage, the clamping voltage is kept substantially constant throughout the subsequent operation of the electrical system 100.

Figure 2:
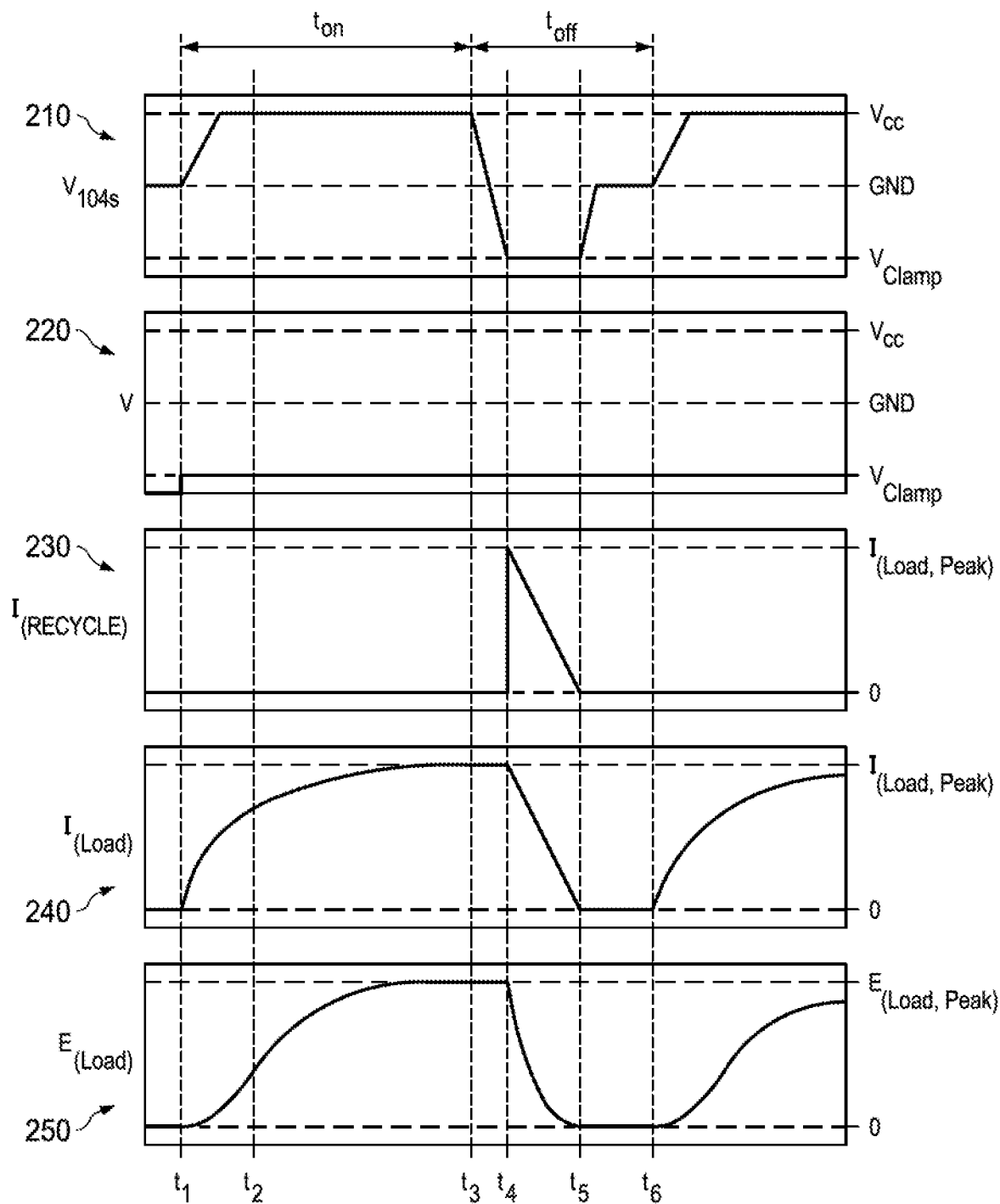
FIG. 2 depicts illustrative graphs depicting timing diagrams of a load from the electrical system, in accordance with various examples.

The controller 102 may now turn on one or more switches 104, 106, 108, and 110 to energize their respective loads. The subsequent operation of the electrical system 100 is now described in tandem with FIG. 2, which depicts illustrative graphs 210, 220, 230, 240, and 250. For the sake of illustration, assume the switch 104 is turned on by the controller 102 at a time instant t1. The voltage at the source terminal 104s increases to the magnitude (e.g., Vcc) of the supply voltage 134 (see graph 210 between time instants t1-t2). The voltage at the source terminal 104s does not increases instantaneously. Therefore, in graph 210, the voltage at the source terminal 104s is shown to increase linearly. As the voltage potential at the source terminal 104s increases to Vcc, a load current beings flowing in the load 112 (see graph 240 between time instants t1-t2). An increasing load current induces a magnetic field in the load 112 to a level dictated by a steady state current I(load, peak), which is given by the ratio of the magnitude of the voltage supply 134 and the resistance of the resistor 113. Due to presence of the inductor 111, the steady state current I(load, peak) is achieved over a finite time (see graph 240 between time instants t1 and t3). Between the time instants t1-t3, the inductor 111 stores energy in the form of magnetic field (see the graph 250). At steady state (time instant t3), the change of the magnetic field as well as the back EMF are substantially zero and, thus, the inductor 111 acts like a short circuit.

Assume that the load 112 has finished its desired mechanical action, e.g., activating another switch (not shown) mechanically at the time instant t3 (the switch 104 is turned on between the time instants t1 and t3 (ton time)). Following the mechanical action, the load 112 needs to restore back in its rest (equilibrium) state. This is done by substantially reducing the current flowing in the load 112 to zero by turning off the switch 104. The controller 102 at time instant t3 turns the switch 104 off. The inductor 111, due to the stored energy, induces an EMF voltage opposite in polarity to the voltage that stored the energy in order to let the current flow continue in the same direction as before turning the switch 104 off. Therefore, as the switch 104 is turned off, the induced EMF voltage forces the freewheeling diode 120 to function in a forward bias mode, meaning that the voltage at an n-junction of the freewheeling diode 120 coupled to the inductor 111 is more negative than the p-junction of the freewheeling diode 120 coupled to the node 137 (whose voltage potential is at the clamping voltage). As the freewheeling diode 120 functions in the forward bias mode, the potential at the source terminal 104s is forced to be at the clamping voltage (see time instant t4 of the graph 210). The forward biased freewheeling diode 120 allows the inductor 111 to discharge the EMF voltage via a discharging current, which is the load current between time instants t4 and t5 (see graph 240).

The discharging current then begins to charge the capacitor 128 and begins to transfer energy from the inductor 111

(see graph 250 between time instants t4, t5) to the capacitor 128. However, as noted above, it is desired for the clamping voltage to remain substantially constant. Therefore, the power converter 130 converts the discharging current into a recycle current $I_{RECYCLE}$ (see graph 230 between time instants t4-t5). The mechanism of this conversion is further described below in FIG. 3.

The recycle current $I_{RECYCLE}$ is transported into either the voltage supply 134, in examples where it is rechargeable or the capacitor 132, in examples where the voltage supply 134 is not configured to receive the recycled current. In other examples, the recycle current $I_{RECYCLE}$ can charge both the capacitor 132 and a rechargeable supply voltage 134. The capacitor 132 and/or the supply voltage 134, once charged by the recycled current $I_{RECYCLE}$, makes the additional energy available to the electrical system 100 in the next switching cycle. This energy transfer from the inductor 111 to the capacitor 132 and/or the supply voltage 134 substantially eliminates the thermal stress exerted on the electrical system 100.

After the EMF voltage of the inductor 111 is discharged, the discharge current substantially subsides to zero (see time instant t5 in the graphs 240), which subsides the recycling current as well (see time instant t5 in the graph 250). At the time instant t5, the potential at the source terminal 104s increases to the ground potential (or zero volts) (see graph 210 at time instant t5) as the freewheeling diode 120 is now reverse biased. At time instant t6, the next turn on cycle may be initiated.

Figure 3:
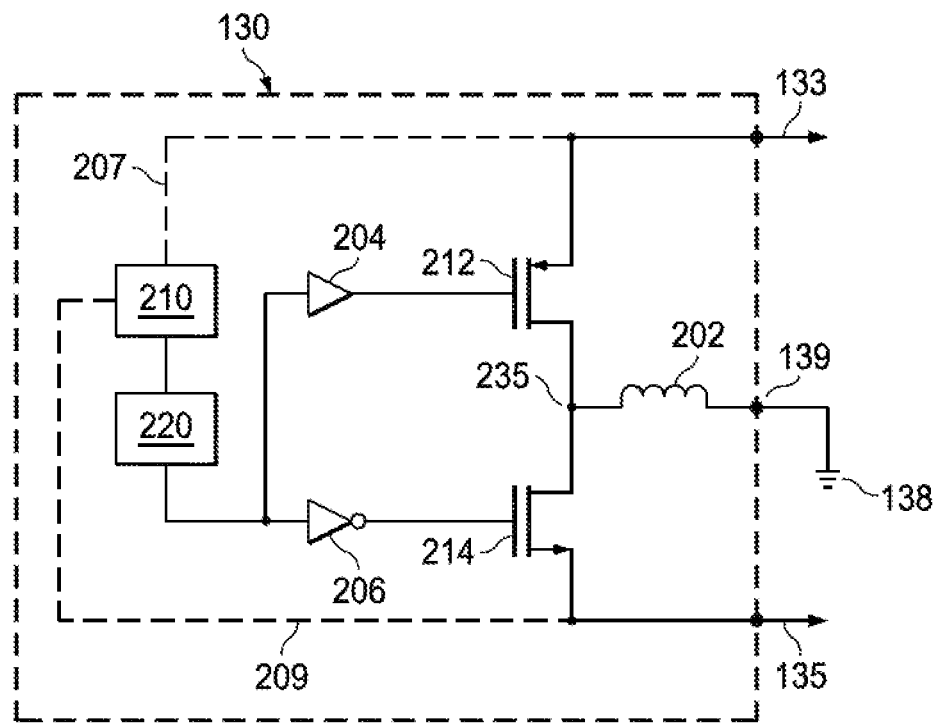
FIG. 3 depicts a schematic diagram of an illustrative power converter of the electrical system, in accordance with various examples.

Referring now to FIG. 3, a schematic diagram of an illustrative power converter 130 is shown. As noted above, in at least one example, the power converter 130 is implemented by a bidirectional inverting buck-boost converter. In one example, the power converter 130 includes a pair of metal oxide semiconductor field effect transistors (MOSFETs) 212 and 214, and at least one energy storage element (illustrated in this example as inductor 202). In another example, the power converter 130 further includes a second inductor (not shown) and/or a fly-capacitor (not shown). In one example, the MOSFET 212 is implemented as a p-type MOSFET (PMOS) and the MOSFET 214 is implemented as an n-type MOSFET (NMOS).

In one example of the power converter 130, a source terminal of the MOSFET 212 is coupled to the node 133, a drain terminal of the MOSFET 212 is coupled to a node 235, and a gate terminal of the MOSFET 212 is coupled to an output terminal of a buffer 204. In such example, a source terminal of the MOSFET 214 is coupled to the node 135, a drain terminal of the MOSFET 214 is coupled to the node 235, and a gate terminal of the MOSFET 214 is coupled to an output terminal of an inverter 206. In another example, the power converter 130 further includes a logic circuit 210 that couples to a pulse width modulation (PWM) generator 220, which further provides input signal to the buffer 204 and inverter 206. The logic circuit 210 may be implemented using any combination of digital or analog technology components, a processor, micro-processor, field-programmable gate array (FPGA), or any other suitable circuitry, the scope of which is not limited herein. The logic circuit 210 is configured to store the clamping voltage of the capacitor 128 and receive, through feedback loops 207, 209, the voltage potential at the nodes 133, 135, respectively. Since the node 135 couples the node 137, the voltage at the node 135 substantially equals the voltage across the capacitor 128 and because the node 133 is coupled to the node 136, the voltage at the node 133 substantially equals to the voltage across the capacitor 132. In an example, this clamping voltage acts as a reference voltage and, at least partially, control (as further described below) one or more voltages of the power converter 130.

In one example, the MOSFETs 212 and 214 are controlled to turn on (e.g., conduct current between their respective drain terminals and source terminals) and/or turn off (e.g., cease conducting current between their respective drain terminals and source terminals) based on a signal received at their respective gate terminals via the buffer 204 and inverter 206, respectively. For example, based on a signal received from the PWM generator 220, either of the MOSFETs 212 or 214 are controlled to turn on or turn off. When the PWM signal is a logic high signal (i.e., 1), the MOSFET 214 receives a gate signal and turns the MOSFET 212 on and at the same time, due to the presence of the inverter 206, the MOSFET 214 doesn't receive a gate signal and remains turned off. On the other hand, when the PWM signal is a logic low signal (i.e., 0), the MOSFET 214 receives a gate signal via the inverter 206 and that turns the MOSFET 214 on, whereas at the same time, due to the presence of the buffer 204, the MOSFET 212 remains turned off. As further described below, the MOSFETs 212, 214 may turn on (or off) based on a value, or relationship between values, present at the nodes 133 and 135. When the PWM generator 220 generates the logic high signal, MOSFET 212 is turned on while MOSFET 214 is turned off. At this time, a path from the node 133 to the ground node 138 is formed through the MOSFET 212 and inductor 202, thereby enabling the inductor 202 to charge from the voltage signal received through the node 133. When the PWM generate 220 generate the logic low signal, MOSFET 212 is turned off while the MOSFET is turned on. At this time, a path from the ground node 138 to the node 135 is formed through the inductor 202 and the MOSFET 214, thereby enabling the inductor 202 to discharge. Due to the charging and discharging of the inductor 202, ratio of the magnitudes of the voltages V1 and V2 equal ratio of the turn on time (or duty cycle) of the MOSFETs 214 and 212. Assume that the voltage at the node 133 is Vcc and the voltage the node 135 is Vclamp, where the Vclamp is desired to be a constant value. In an example where Vclamp is zero, the duty cycle of the MOSFETs 214 and 212 may be controlled to increase the voltage of the node 135 to a desired Vclamp voltage. In examples where the magnitude of Vclamp changes, the duty cycle of the MOSFETs 214 and 212 may be controlled such that restore the previous value Vclamp. Therefore, in at least an example, in order to dynamically control the duty cycle of the MOSFETs 214, 212, the duty cycle of the PWM generator 220 may be dynamically controlled by the logic circuit 210 to further regulate the Vclamp voltage.

The PWM generator 220 performs dynamic control of the duty cycle, in at least one example, by comparing the voltage at the node 135 with the clamping voltage stored in the power converter 130. Based on this comparison, the duty cycle of the PWM generator 220 is adapted such as to keep the voltage at the node 135 substantially constant. For example, if determined by the logic circuit 210 that the magnitude of Vclamp is larger than the reference voltage (or the clamping voltage) stored in it, the logic circuit 210 adapts the duty cycle of the PWM generator 220 and transfers the excess voltage to the voltage supply 134 (in an example where the voltage supply 134 is rechargeable). In examples where voltage supply 134 is not rechargeable, the excess voltage may be stored in a bulk capacitor, such as the capacitor 132 of FIG. 1.

Figure 8:
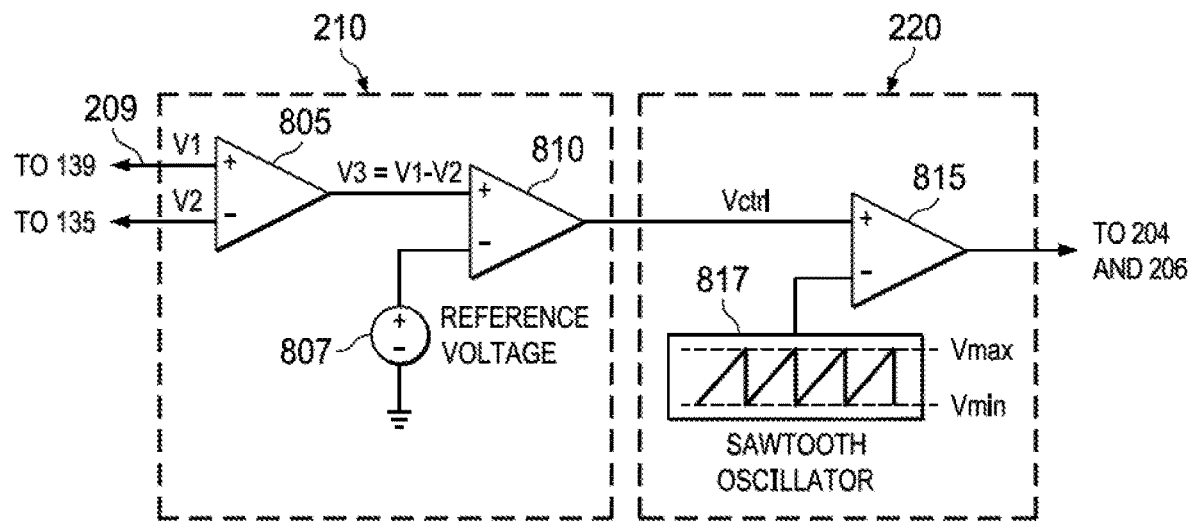
FIG. 8 depicts an illustrative logic circuit and pulse width modulation (PWM) generator, in accordance with various examples.

Refer briefly to FIG. 8 that depicts an illustrative logic circuit 210 and PWM generator 220, in accordance with various examples. In one example, the logic circuit 210 includes a differential amplifier 805 and an error amplifier 810. A positive terminal of the differential amplifier 805 is coupled to the node 139 that further couples to the ground node 138. A negative terminal of the differential amplifier 805 is coupled to the node 135 via the feedback loop 209. An output terminal of the differential terminal is coupled to a positive terminal of the error amplifier 810; a negative terminal of the error amplifier is coupled to a reference voltage source 807. In one example, the PWM modulator 220 includes a comparator 815 whose positive terminal is coupled to the output terminal of the error amplifier. A negative terminal of the comparator 815 is coupled to a sawtooth oscillator 817. An output terminal of the comparator 815 provides signal to the buffer 204 and inverter 206.

The adaptation of the duty cycle of the PWM modulator 220 is now described with respect to FIG. 8. The output of the differential amplifier 805 (V3) has a voltage corresponding to the difference of its two inputs (V1-V2). The voltage V3 is compared by the error amplifier to a reference voltage received by the reference voltage source 807. If V3 is larger than the constant reference voltage, the error amplifier 810 outputs a voltage that is an amplified version of the voltage on the positive terminal of the differential amplifier 805. If V3 is smaller than the reference voltage, the error amplifier 810 outputs an amplified version of the voltage at the negative terminal of the differential amplifier 805. For simplicity's sake, the output voltage of the error amplifier 810 is referred to as a control voltage (Vctrl). The control voltage Vctrl is provided to the comparator 815 and is compared against a sawtooth voltage received from the sawtooth oscillator. If Vctrl is larger than the sawtooth voltage, the output of the comparator 220 is a logical high signal; if Vctrl is smaller than the sawtooth voltage, the output of the comparator 220 is a logical low signal. This creates a pulse width modulated rectangular signal with the same frequency as the frequency of the sawtooth oscillator 817. If Vctrl is in the middle of the maximum and minimum voltage of the sawtooth voltage, then the duty cycle of the PWM signal (output of the comparator 815) is about 50%. However, if Vctrl is substantially similar to the minimum voltage of the sawtooth oscillator 815, the duty cycle is about 0%; if Vctrl is substantially similar to the maximum voltage of the sawtooth oscillator 817, then the duty cycle is almost 100%. The rest of the circuit of FIG. 3 responds to the duty cycle, which depends on the voltages between the nodes 139 and 135. Per description above, when the voltage difference between the nodes 139 and 135 is larger than the reference voltage 807, then the duty cycle adapts so that the voltage gets smaller until it matches the reference voltage.

Now refer briefly to the operation of the electrical system 100. For illustration's sake, assume that the electrical system 100 employs a 24V voltage supply 134 and the desired clamping voltage of the capacitor 128 is −20V. When the electrical system 100 is turned on for the first time, the logic circuit 210 (FIG. 2) compares the voltage potential at the node 135 (or node 137) with the desired clamping voltage of −20V. Since the electrical system 100 is freshly turned on, the potential at the node 135 is substantially zero. Therefore, the logic circuit 210 adapts the duty cycle of the PWM generator 220 such that a charging current flows from the voltage supply 134 to the capacitor 128 to charge it to the clamping voltage. When the system requires a regulated and defined charging current then the adaptation of the duty cycle must happen gradually. Once the capacitor 128 is charged, the recycling circuit 140 is said to be functional. Now following the mechanical action, the one or more loads 104, 106, 108, and 110 releases a discharging current then begins to charge the capacitor 128 and tries to transfers energy from the inductor 111 to the capacitor 128. As described above, the power converter 130 is configured to maintain a constant clamping voltage across the capacitor 128. At this point, the power converter 130 detects a slight (few mV) increase of the magnitude of the clamping voltage by comparing the voltage at the node 135 with the reference (or clamping) voltage stored in the power converter 130 and converts the discharging current into a recycle current $I_{RECYCLE}$ by adapting the duty cycle of the PWM generator 220.

Figure 4:
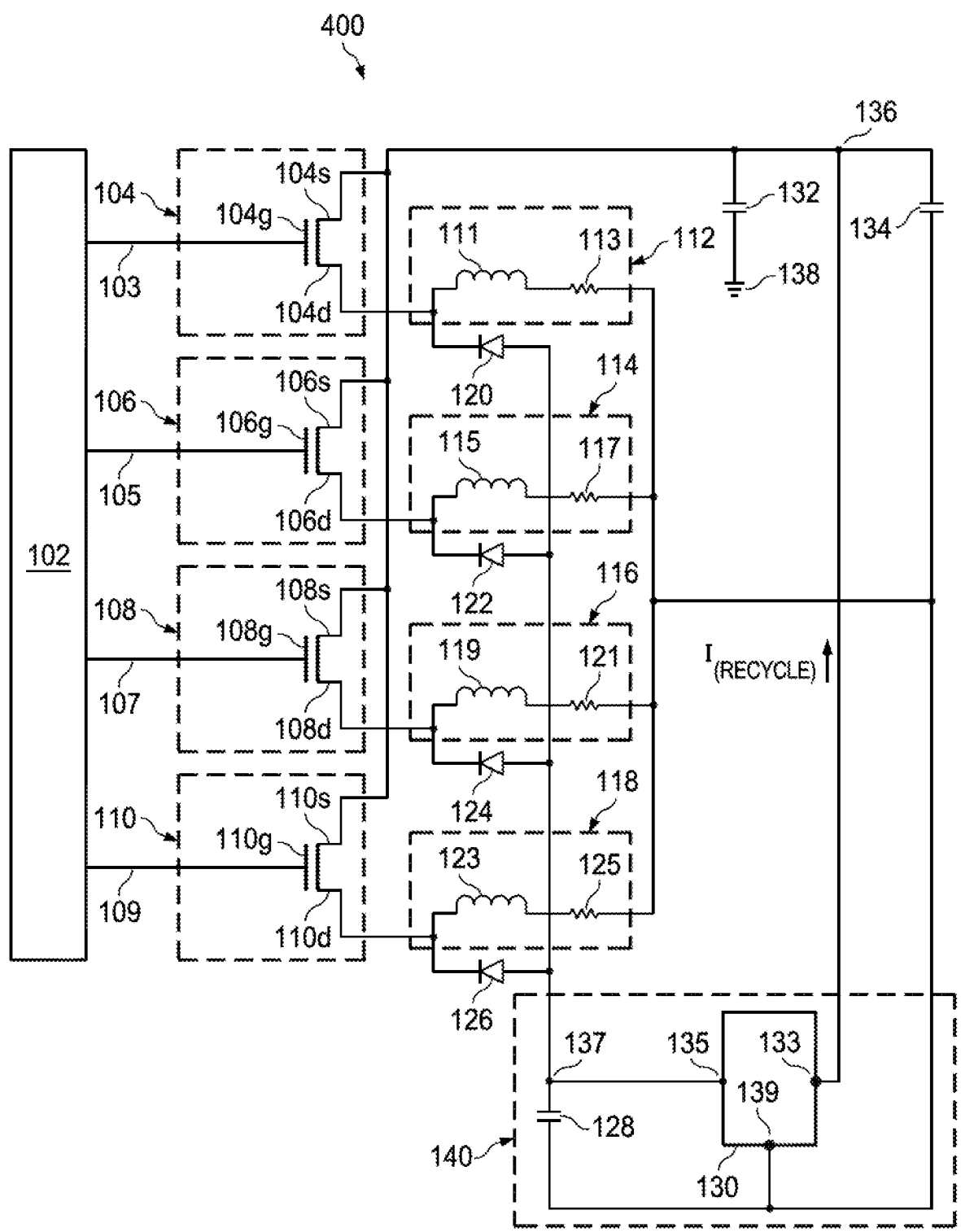
FIG. 4 depicts a schematic diagram of an illustrative electrical system adapted to function in a low-side configuration, in accordance with various examples.

Referring now to FIG. 4, a schematic diagram of an illustrative electrical system 400 adapted to function in the low-side configuration is shown. The description of FIG. 1 applies to FIG. 4 except that the source terminals 104s, 106s, 108s, and 110s of the switches 104, 106, 108, and 110 now couple to the low-side (or the negative terminal) of the voltage supply 134. Additionally, the p-junctions of the freewheeling diodes 120, 122, 124, and 126 now couple to the drain terminals 104d, 106d, 108d, and 110d, respectively, and the n-junctions of the freewheeling diodes 120, 122, 124, and 126 now couple to each other at the node 137. The example depicted in FIG. 4, one terminal of the loads 112, 114, 116, and 118 couple with each other at a node 141, which is further coupled to the positive terminal of the voltage source 134, and the other terminal of the loads 112, 114, 116, and 118 couple to the drain terminals 104d, 106d, 108d, and 110d, respectively. In at least an example of the low side configuration, one terminal of the capacitor 128 couples to the node 137 and the other terminal of the capacitor 128 couples to the terminal 139 and the node 141. The electrical system 400 functions similar to the electrical system 100 and the general description of the operation of the electrical system 100 applies to the operation of the electrical system 400. For example, when the electrical system 400 is turned on for the first time, the recycling circuit 140 needs to be enabled in order for it to be functional. Recycling circuit 140 is enabled by charging the capacitor 128 to a clamping voltage, and in the case of the low-side configuration this clamping voltage is positive. The power converter 130 then charges the capacitor 128 to the clamping voltage, for example, +20V above the positive battery terminal. As noted above, it is then desired to keep the clamping voltage substantially constant throughout the subsequent operation of the electrical system 100. The controller 102, as desired by the application, may now turn on one or more switches 104, 106, 108, and 110 to energize one or more loads.

For the sake of illustration, again assume the switch 104 is turned on by the controller 102. The voltage at the drain terminal 104d increases to the magnitude (e.g., Vcc) of the supply voltage 134. As the voltage potential at the source terminal 104s increases to Vcc, a load current beings flowing in the load 112. An increasing load current induces a magnetic field in the load 112 to a level dictated by a steady state current that is given by the ratio of the magnitude of the voltage supply 134 and the resistance of the resistor 113. Due to presence of the inductor 111, the steady state current is achieved over a finite time.

Assume that the load 112 has finished its desired mechanical action, e.g., activating another switch (not shown) mechanically. Following the mechanical action, the load 112 needs to restore back in its rest (equilibrium) state. This is done by substantially reducing the current flowing in the load 112 to zero by turning off the switch 104. The inductor 111, due to the stored energy, induces an EMF voltage opposite to the polarity of the voltage that stored the energy in order to let the current flow continue in the same direction as before turning the switch 104 off. Therefore, as the switch 104 is turned off, the induced EMF voltage forces the freewheeling diode 120 to function in a forward bias mode. As the freewheeling diode 120 functions in the forward bias mode, the potential at the drain terminal 104*d* is forced to be at the clamping voltage. The forward biased freewheeling diode 120 allows the inductor 111 to discharge the EMF voltage via a discharging current. The discharging current then begins to charge the capacitor 128 and begins to transfer energy from the inductor 111 to the capacitor 128. However, as noted above, it is desired for the clamping voltage to remain substantially constant. Therefore, the power converter 130 converts the discharging current into a recycle current $I_{RECYCLE}$ and further charge the capacitor 132 and/or the voltage supply 134.

Figure 5A:
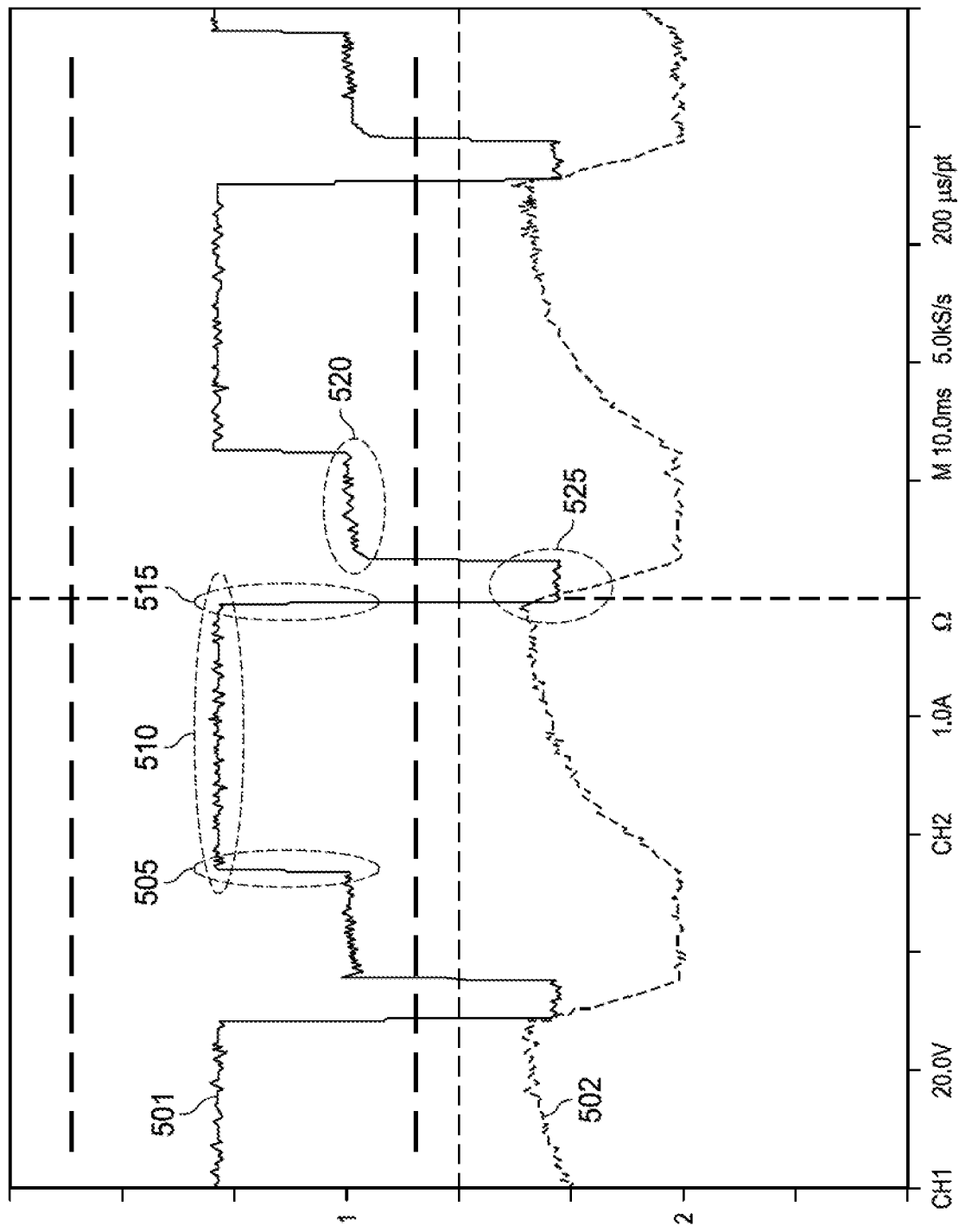
FIG. 5(*a*) depicts an illustrative oscilloscope diagram depicting voltage and current curves of an electrical system that excludes a recycling circuit, in accordance with various examples.

Referring now to FIG. 5(*a*), an illustrative oscilloscope graph 500 depicting a voltage curve 501 and a current curve 502 of an electrical system that excludes the recycling circuit of FIG. 1 is shown. In order to produce the curves 501, 502, an electromagnetic valve is used as the inductive load. When the load is supplied with current (meaning that when the load is energized), it opens and allows a liquid to flow through. When it is de-energized, meaning when the current flow stops, the load closes and the liquid flow stops. This energizing and de-energizing is controlled by a switch, which is coupled to a control unit. The voltage curve 501 is the voltage at a terminal (e.g., a source terminal) of the switch and the current curve 502 depicts the current flowing in the inductive load.

The region marked by numeral 505 is a portion of the curve 501 that depicts the voltage state of the switch that is controlling the inductive load. As the control unit turns the switch on, the impedance of the switch drops, and it begins conducting current and energizes the inductive load in order to initiate an electromechanical action. The region marked by numeral 510 is a portion of the curve 501 that depicts the voltage state of the switch when the current through the inductive load increases (see the curve 502 corresponding to the portion 510) to its steady state value. The region marked by numeral 515 is a portion of the curve 501 that depicts the voltage state of the switch when the switch is turned off by the controller controlling the switch. At this point, the switch introduces high impedance; the energizing period ends; the de-energizing period begins; and the electromechanical action performed by the inductive load ends. Further, the voltage at the switch drops to a negative voltage due to the presence of a stored EMF voltage in the inductive load. This negative voltage is clamped using some clamping elements.

Still referring to FIG. 5(*a*), The region marked by numeral 525 is a portion of the curve 501 that depicts the voltage state of the switch when the switch, using some clamping elements such as a diode/zener diode, clamps the voltage to a negative voltage and current decreases to zero while the stored energy is released by the inductive load. This negative voltage can be approximated by summing the voltage drop of the clamping element (e.g., diode) and the gate to source voltage of the switch and subtracting the sum from the power supply voltage. This negative voltage should be dissipated. The electrical system used to produce the curves shown in FIG. 5(*a*) thermally dissipates this negative voltage.

Figure 5B:
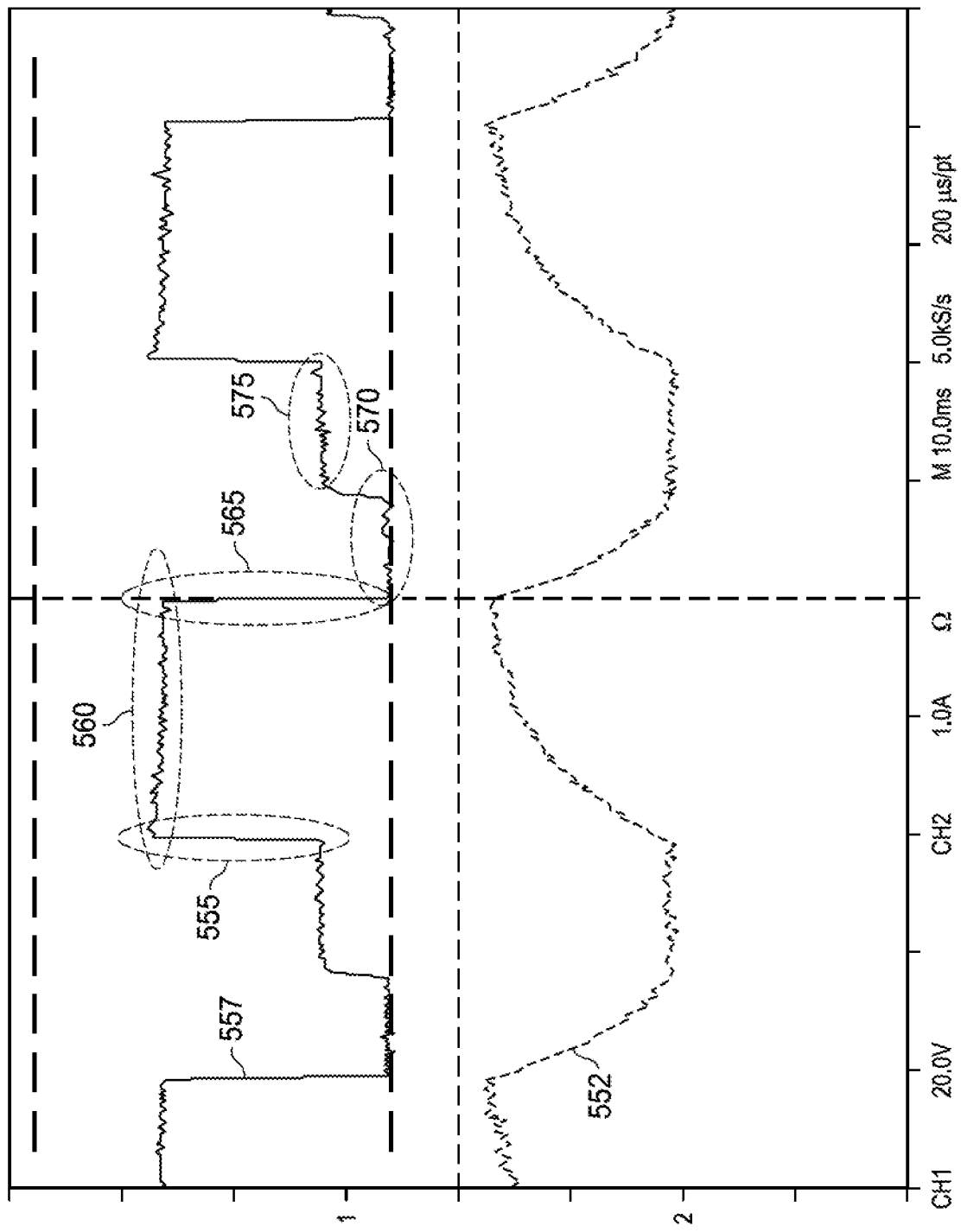
Figure 6A:
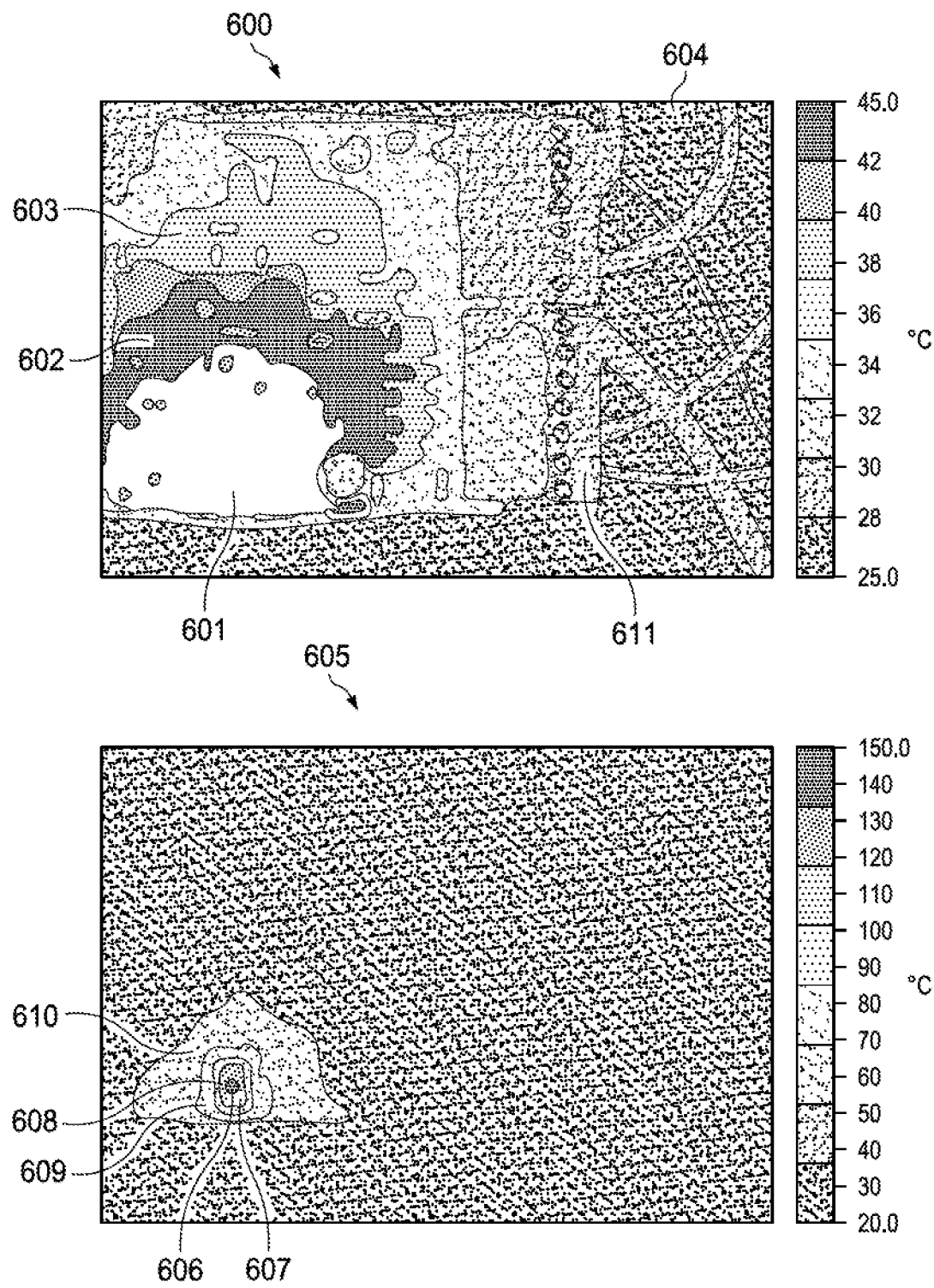
FIG. 6(*a*) depicts an illustrative thermal image of the electrical system of FIG. 5(*a*), in accordance with various examples.

FIG. 6(*a*) depicts illustrative thermal images 600, 605 of an illustrative electrical system 611, which is similar to the electrical system of FIG. 5(*a*). The thermal images 600, 605 depict the heat signature near the electrical system 611 when the electrical system 611 dissipates the stored EMF and switches between the inductive loads at a certain fixed frequency. In other words, the thermal images 600, 605 show the heat released during dissipation of the EMF voltage and the thermal stress experienced by the switches controlling the inductive loads inducing the EMF voltages. The electrical system 611 includes an electrical board (not expressly marked in FIG. 6(*a*)) used to turn on/off the inductive load coupled to the electrical board. The electrical board also includes a dissipation circuit to dissipate the stored EMF. The thermal image 600 has a scale from 25° C. to 45° C. Region 601 is a region surrounding the electrical system 611 and has a temperature above 45° C.; region 602 is another region radially-away from the region 601 and has a temperature between the range of 40° C. and 45° C.; region 603 is radially-away from the region 602 and has a temperature between the range of 30° C. and 40° C.; and region 604 is radially-away from the regions 601-603 and has a temperature that is less than 30° C. The thermal image 605 shows thermal images of the same electrical system 611 but has a scale from 20° C. to 150° C. Due to the temperature range of the new scale, the electrical system 611 is not readily visible in the thermal image 605. From the new scale's perspective, region 606 that is near the electrical system 611 and has a temperature above 150° C.; region 607 is radially-away from the region 606 and has a temperature between the range of 120° C. and 150° C.; region 608 is radially-away from the region 607 and has a temperature between the range of 95° C. and 110° C.; region 609 is radially-away from the region 608 and has a temperature between the range of 75° C. and 95° C.; and region 610 is radially-away from the region 609 and has a temperature less than 75° C. It is apparent from the thermal image 605 that the thermal stress experienced by the switches controlling the inductive loads inducing the EMF voltages is over 150° C. without the presence of a recycling circuit. Referring back to FIG. 5(*a*), numeral 520 denotes a portion of the curve 501 that depicts the voltage state of the switch when the electrical circuit is resting and the switch is turned off.

The curves 501, 502 are similar to the curves shown in the graphs 210, 240, except that the curves of the graphs 210, 240 show the electrical state of the electrical system of FIG. 1 that includes the recycling circuit 140, whereas the curves 501, 502 depict the electrical state of the electrical system that excludes the recycling circuit.

Now referring to FIG. 5(*b*), an illustrative oscilloscope graph 550 depicting a voltage curve 551 and a current curve 552 of an electrical system similar to the electrical system 100 that includes the recycling circuit 140 is shown. The curves 551, 552 are similar to the curves 501, 502, respectively, except for the absence of the negative voltage in curve 551. As described in detail ahead, the negative voltage is recycled (rather than thermally dissipated) using the recycling circuit, such as the recycling circuit 140.

Similar to the curves of FIG. 5(*a*), in order to produce the curves 551, 552, the same electromagnetic valve as the inductive load is employed (e.g., similar to the loads 112, 114, 116, and 118). When the load is supplied with current (meaning that when the load is energized), it opens and allows a liquid to flow through. When it is de-energized, meaning when the current flow stops, the load closes and the liquid flow stops. This energizing and de-energizing is controlled by a switch (similar to the switches 104, 106, 108, and 110), which is connected to a control unit (similar to the control unit 102). The voltage curve 551 is the voltage at a terminal (e.g., a source terminal) of the switch and the current curve 552 shows the current flowing in the inductive load.

The region marked by numeral 555 is a portion of the curve 551 that depicts the voltage state of the switch that is controlling the inductive load when it is turned on and begins energizing the inductive load in order to initiate an electromechanical action. The region marked by numeral 560 is a portion of the curve 551 that depicts the voltage state of the switch when the current through the load increases (see the curve 552 corresponding to the portion 560) to its steady state value. The region marked by numeral 565 is a portion of the curve 551 that depicts the voltage state of the switch when the switch is turned off (by the controller controlling the switch). At this point, the switch introduces high impedance; the energizing period ends; the de-energizing period begins; and the electromechanical action performed by the inductive load ends. The region marked by numeral 570 is a portion of the curve 551 that depicts the voltage state of the switch when the switch, using clamping elements such as a capacitor, clamps the voltage to a fixed voltage and current decreases to zero while the stored energy is recycled by the recycling circuit. This recycling avoids thermal dissipation of the stored energy.

Figure 6B:
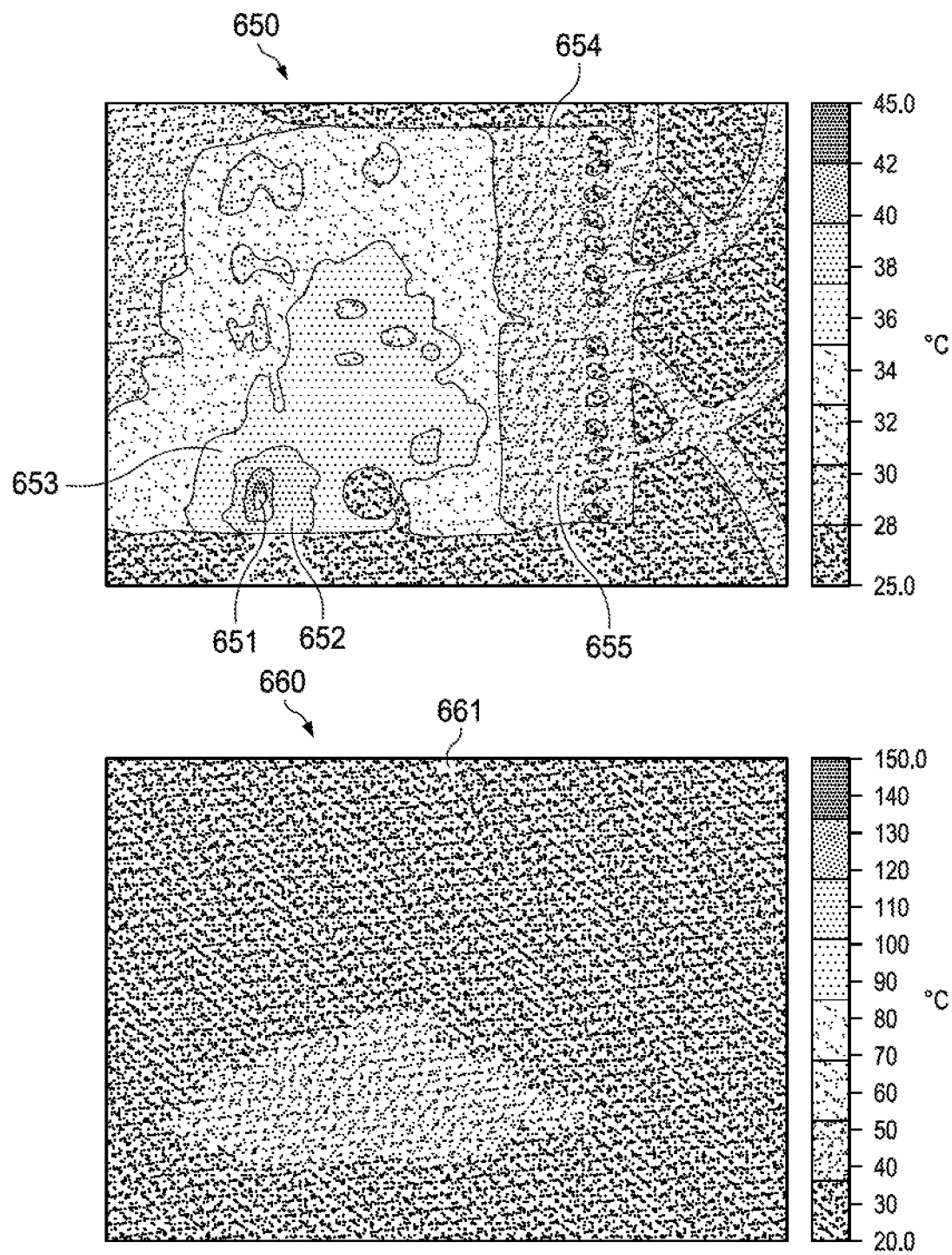

FIG. 6(b) depicts illustrative thermal images 650, 660 of an illustrative electrical system 655, which is similar to the electrical system of FIG. 5(b). The thermal images 650, 660 depict the heat signature near the electrical system 655 when the electrical system 655 dissipates the stored EMF and switches between the inductive loads at a certain fixed frequency. The electrical system 655 is similar to the electrical system 100 and includes an electrical board (not expressly marked in FIG. 6(b)) used to turn on/off the inductive load coupled to the electrical board. The electrical board also includes a recycling circuit to recycle the stored EMF. The thermal image 650 has a scale from 25° C. to 45° C. Region 651 is a region surrounding the electrical system 655 and has a temperature between 35° C. and 40° C.; region 652 is radially-away from the region 651 and has a temperature between the range of 36° C. and 40° C.; region 653 is radially-away from the region 652 and has a temperature between the range of 34° C. and 36° C.; and region 654 is radially-away from the region 653 and has a temperature that is less than 34° C. The thermal image 660, on the other hand, has a scale from 20° C. to 150° C. Due to the temperature range of the new scale, the electrical system 655 is not readily visible in the thermal image 660. The thermal image 660 depicts a region 661 that shows a temperature below 40° C. Thus, it is clear from the thermal images 650, 660 that the thermal stress experienced by the switches controlling the inductive loads inducing the EMF voltages is less than 40° C. with the presence of a recycling circuit, such as the recycling circuit 140. Thus, the thermal stress experienced by the electrical system 655 (such as the electrical system 100 of FIG. 1) used to generate the curves of FIG. 5(b) is substantially less than the thermal stress experienced by the electrical system used to generate the curves of FIG. 5(a). Refer back to FIG. 5(b), 575 is a portion of the curve 551 that depicts the voltage state of the switch when the electrical circuit is resting and the switch is turned off.

Figure 7:
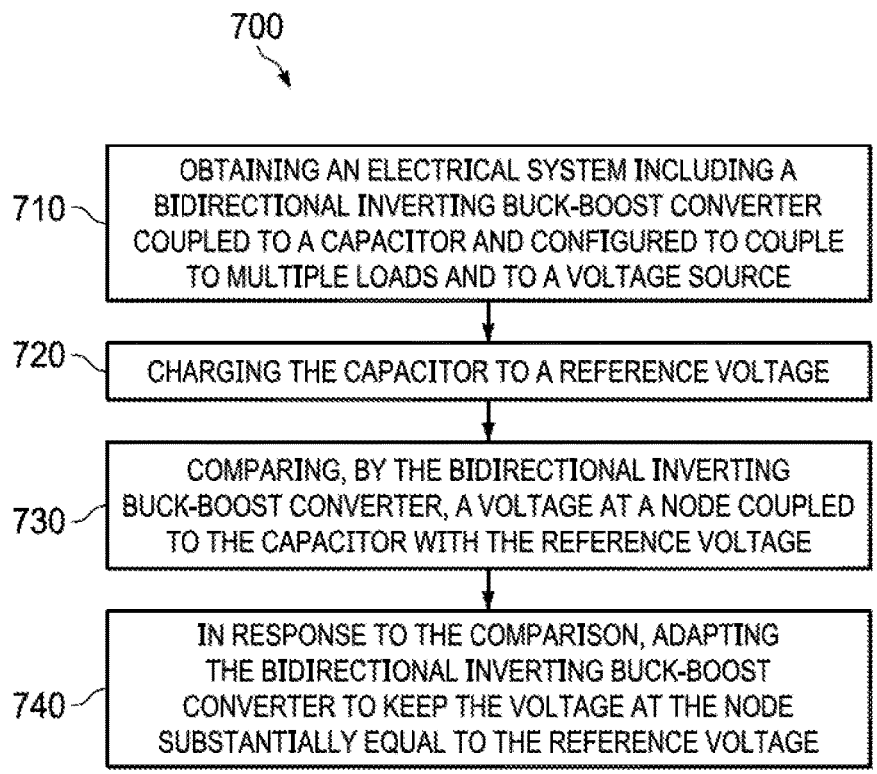
FIG. 7 depicts an illustrative method that describes the functioning of the electrical system of FIG. 1, in accordance with various examples.

Referring now to FIG. 7, an illustrative method 700 describing the functioning of the electrical system 100 is shown. The method 700 is described in tandem with FIG. 1. The method 700 begins with a step 710 that includes obtaining an electrical system, such as the electrical system 100, including a bidirectional inverting buck-boost converter (such as the bidirectional inverting buck-boost converter 130), which is coupled to a capacitor (such as the capacitor 128) and configured to couple to multiple loads (such as the loads 104, 106, 108, and 110) and to a voltage source (such as the voltage supply 134). The method 700 proceeds with step 720, which includes charging the capacitor (e.g., the capacitor 128) to a reference voltage (or a clamping voltage). For example, when the electrical system 100 is turned on for the first time, the bidirectional inverting buck-boost converter 130 compares the voltage potential at the node 135 (or node 137) with a desired clamping voltage stored in the bidirectional inverting buck-boost converter 130. Since the electrical system 100 is turned on for the first time, the potential at the node 135 is substantially zero. Therefore, the bidirectional inverting buck-boost converter 130 is adapted such that a charging current flows from the voltage supply 134 to the capacitor 128 to charge it to the clamping voltage.

Following the step 720, the method 700 proceeds to a step 730 that includes comparing a voltage at a node, such as the node 137, with the desired clamping voltage stored in the bidirectional inverting buck-boost converter. The step 730 is similar to the step performed by the bidirectional inverting buck-boost converter when the electrical system 100 is turned on for the first time, where the bidirectional inverting buck-boost converter 130 compares the voltage at the node 137 with the stored voltage value in the bidirectional inverting buck-boost converter 130. The step 730 is regularly (e.g., at a fixed interval) performed by the electrical system 100. In an example, the step 730 is performed continuously by the bidirectional inverting buck-boost converter 130. After the step 730, the method 700 moves to a step 740 that includes adapting the bidirectional inverting buck-boost converter 130 to keep the voltage at the node substantially equal to the reference voltage in response to the comparison performed in the step 730.

In the foregoing discussion and in the claims, the terms "including" and "comprising" are used in an open-ended fashion, and thus should be interpreted to mean "including, but not limited to . . . " An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device, comprising:
   a capacitor;
   a bidirectional inverting buck-boost converter coupled to the capacitor and configured to couple to multiple loads and to a voltage source, wherein the bidirectional inverting buck-boost converter is configured to:
    compare a voltage across the capacitor with a reference voltage; and
    based on the comparison, facilitate converting a dissipation current flowing from one of the multiple loads into a recycling current.

2. The device of claim 1 further comprising a second capacitor coupled to the bidirectional inverting buck-boost converter.

3. The device of claim 2, wherein the bidirectional inverting buck-boost converter is configured to charge the second capacitor using the recycling current.

4. The device of claim 1, wherein at least one of the multiple loads include an inductor.

5. The device of claim 1, wherein the bidirectional inverting buck-boost converter is further configured to:
    compare the voltage across the capacitor with the reference voltage; and
    based on the comparison, facilitate charging the capacitor to the reference voltage.

6. The device of claim 1, the bidirectional inverting buck-boost converter comprising:
    a digital circuit;
    a pulse width modulation (PWM) signal generator coupled to the digital circuit;
    a plurality of switches coupled to the PWM signal generator; and
    an inductor coupled to the plurality of switches.

7. The device of claim 6, wherein the PWM signal generator is configured to adapt a duty cycle of a signal controlling the plurality of switches to charge the capacitor to the reference voltage.

8. The device of claim 6, wherein the PWM signal generator is configured to adapt the duty cycle of a signal controlling the plurality of switches to convert the dissipation current into the recycling current, wherein the recycling current is provided to a second capacitor.

9. The device of claim 6, wherein the PWM signal generator is configured to adapt the duty cycle of a signal controlling the plurality of switches to convert the dissipation current into the recycling current, wherein the recycling current is provided to the voltage source.

10. The device of claim 1, wherein the bidirectional inverting buck-boost converter is configured to maintain a substantially constant voltage across the first capacitor.

11. A system, comprising:
    a controller;
    a first switch coupled to the controller;
    a load coupled to the switch;
    a bidirectional inverting buck-boost converter coupled to the switch, the load, and a voltage supply, wherein the bidirectional inverting buck-boost converter comprises:
        a digital circuit;
        a pulse width modulation (PWM) signal generator coupled to the digital circuit;
        a plurality of switches coupled to the PWM signal generator; and
        an inductor coupled to the plurality of switches;
    a first capacitor coupled to the switch and the load, wherein the first capacitor is coupled to the bidirectional inverter buck-boost converter at a first node; and
    a second capacitor coupled to the bidirectional inverting buck-boost converter and the switch.

12. The system of claim 11, wherein the bidirectional inverter buck-boost converter is configured to charge the first capacitor to a first voltage level when the system is turned on for the first time.

13. The system of claim 11, wherein the bidirectional inverting buck-boost converter is configured to compare a voltage level at the first node with a pre-defined voltage level stored in the bidirectional inverting buck-boost converter.

14. The system of claim 11, wherein the bidirectional inverting buck-boost converter is configured to convert a discharge current received from the load to a recycling current by adapting a duty cycle of the PWM signal generator.

15. The system of claim 11, wherein the bidirectional inverting buck-boost converter is configured to maintain a substantially constant voltage across the first capacitor.

16. A method, comprising:
    obtaining a bidirectional inverting buck-boost converter coupled to a capacitor and configured to couple to multiple loads and to a voltage source;
    charging the capacitor to a reference voltage;
    comparing, by the bidirectional inverting buck-boost converter, a voltage at a node coupled to the capacitor with the reference voltage; and
    in response to the comparison, adapting the bidirectional inverting buck-boost converter to keep the voltage at the node substantially equal to the reference voltage,
    wherein adapting the bidirectional inverting buck-boost converter to keep the voltage at the node substantially equal to the reference voltage converts a discharge current received from the load to a recycling current.

17. The method of claim 16, wherein charging a second capacitor that is coupled to the bidirectional inverting buck-boost converter by the recycling current.

18. The method of claim 16, wherein charging the voltage source by the recycling current.

19. The method of claim 16, wherein the bidirectional inverting buck-boost converter is coupled to a second capacitor.

* * * * *